TEMPERATURE INDEPENDENT AMPLIFIER AND METHOD

Filed June 4, 1963

NORMAN C. WALKER
CHARLES E. ENGLE
INVENTORS.

BY Nilsson & Robbins
ATTORNEYS.

United States Patent Office 3,346,817
Patented Oct. 10, 1967

3,346,817
TEMPERATURE INDEPENDENT AMPLIFIER AND METHOD
Norman C. Walker, Newport Beach, and Charles E. Engle, Tustin, Calif., assignors to Dana Laboratories, Inc., Santa Ana, Calif., a corporation of California
Filed June 4, 1963, Ser. No. 285,360
3 Claims. (Cl. 330—23)

Figure 1:
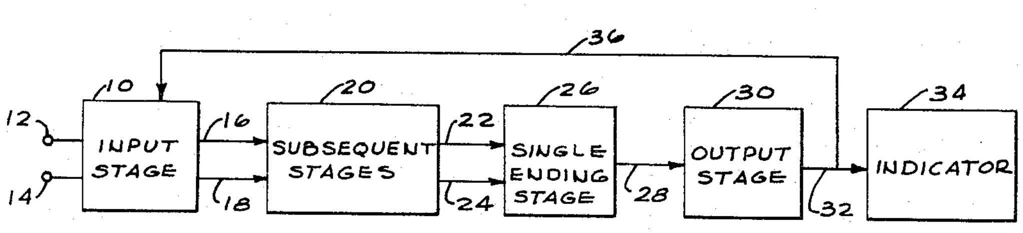

This invention relates generally to low frequency transistor amplifiers, and more particularly to differential amplifiers in which the amplifier sensitivity tends deleteriously to be temperature dependent.

A principal object of the present invention is to provide a direct current differential amplifier and method for use at very low input signal levels, as in instrumentation applications, and which, to a very high order, has a zero temperature coefficient. In this connection, much of the discussion and examples given in this specification relate for clarity and brevity to the input stage of a transistorized direct current differential amplifier in which a low-level differential input signal is impressed upon the control electrodes of a pair of differential sensitive input transistors. However, it is expressly pointed out, as will become apparent, that the principles of the invention apply with the same advantages to other types of circuits such as, for example, alternating current amplifiers or amplifiers designed for operation at higher signal levels or circuits utilizing active elements other than transistors.

In accordance with a generally accepted prior art approach, the base to emitter temperature dependence is cancelled out, in large measure, by the differential sensitive, double input circuit which cancels effects experienced by the transistors in common; and further improvements are achieved by careful selection of the "opposed" transistors so that their temperature characteristics are as identical as possible.

In addition, recent developments in transistor technology have significantly both decreased the absolute magnitude of this temperature coefficient as well as increased the repeatability in this regard of successively manufactured transistors so that better matching can be achieved.

Other prior art attempts to eliminate or minimize the indicated temperature dependence have typically been directed toward providing a temperature controlled environment for the circuit so that the transistors, if balanced at the temperature of that environment, will remain balanced for so long as that ambient temperature is held. Another approach has been to couple the amplifier with elaborate external circuitry to force the balancing of the temperature coefficients.

However, even the better of such prior art techniques or the combination of a plurality of them suffer the disadvantages either of providing less than desirable accuracy and freedom from drift, or of being undesirably complex, costly, bulky, and subject to high maintenance costs or short life.

In a copending application (entitled, Direct-Current Amplifier, filed Aug. 27, 1962, by N. C. Walker and J. A. Nelson, now U.S. Patent No. 3,185,932 and assigned to the assignee of the present application) a system and method are disclosed which provide a relatively high degree of temperature stability in an amplifier of the general character involved here. In that disclosure, it is shown that by systematically adjusting the parameters of a particular amplifier for zero temperature unbalance at a given ambient temperature, the amplifier, to a high order of accuracy extrapolates the conditions throughout a large range of ambient temperatures.

A particular object of the present invention is to provide a differential amplifier which achieves significantly improved ambient temperature effect cancellation.

It is another object to provide such an amplifier which is not subject to the noted as well as other deficiencies and disadvantages of the prior art.

It is another object to provide a temperature stable transistor differential amplifier which is structurally relatively simple and adaptable to low cost mass production techniques.

It is another object to provide such an amplifier which does not require extensive or tedious calculations and calibration for temperature independent accuracy over wide temperature ranges.

It is another object to provide such an amplifier which achieves temperature stability without the utilization of external circuitry or temperature control mechanisms.

It is another object to provide a differential amplifier for low frequency and direct current low-level input signals which does not require costly matching of transistors.

It is another object of the present invention to provide a method of adjusting a dual transistor amplifier stage for zero temperature coefficient over a wide temperature range, which method is simple and efficient and may be readily accomplished in the field without special equipment and instruments.

Briefly, these and other objects and advantages are achieved in accordance with the features of a structural example of the invention in which a four terminal amplifier stage includes a pair of transistors whose base electrodes are the input terminals and whose collector electrodes are the output terminals. The collectors are coupled through load resistors to a source of positive potential; at least one of the resistors being variable to balance the magnitudes of current flowing through the transistors. The emitters are returned through a common emitter circuit to a negative supply, and a variable resistor is interconnected between at least one of the emitters and the common circuit.

In operation, the two parallel current paths through the load resistors, the transistors, and the emitter circuits are, in this example and in accordance with the principles of the present invention, made to be equal in magnitude throughout a wide temperature range. To accomplish this, the base electrodes are shorted together and the emitters are shorted together to assure that the only unbalance in the amplifier stage is in the collector circuit. Accordingly, the variable load resistor in the collector circuit is adjusted under these conditions to provide zero output signal as measured between the collector electrodes. With the balance thusly struck, the emitters are unshorted and the emitter circuit is balanced for zero output signal between the collector electrodes.

If the transistors have been selected to have approximately equal temperature coefficients, where the term is defined as the change in the base to emitter voltage per degree Kelvin, the temperature dependence throughout a wide range of ambient temperature will be close to zero and will, for many applications, be satisfactory without further temperature correction. However, in many modern utilizations, such as, for example, in instrumentation, greater accuracy is either highly desirable or is, at all costs, mandatory.

The greater accuracy may be achieved, as desired, in this example of the invention, by running a simple temperature dependence curve, voltage between collectors as a function of ambient temperature with zero input signal, of the system. The characteristic thus plotted is substantially linear and can be readily stated as a certain of microvolts per degree Kelvin. This number is then multiplied by the steady state absolute temperature of the environment of the transistors to provide a steady state temperature correction voltage.

The variable resistor in the emitter circuit of one of the transistors is then adjusted to provide the steady-state correction voltage output between the collectors. Then, as a final step, the output signal is again nulled by adjusting the variable resistor in the collector circuit.

Thus the residual temperature coefficient, after the first balancing of the collector load and emitter circuits for zero output signal, is precisely cancelled by deliberately making the effective base to emitter voltages of the two transistors unequal by an amount equal to the known unbalance.

Figure 2:
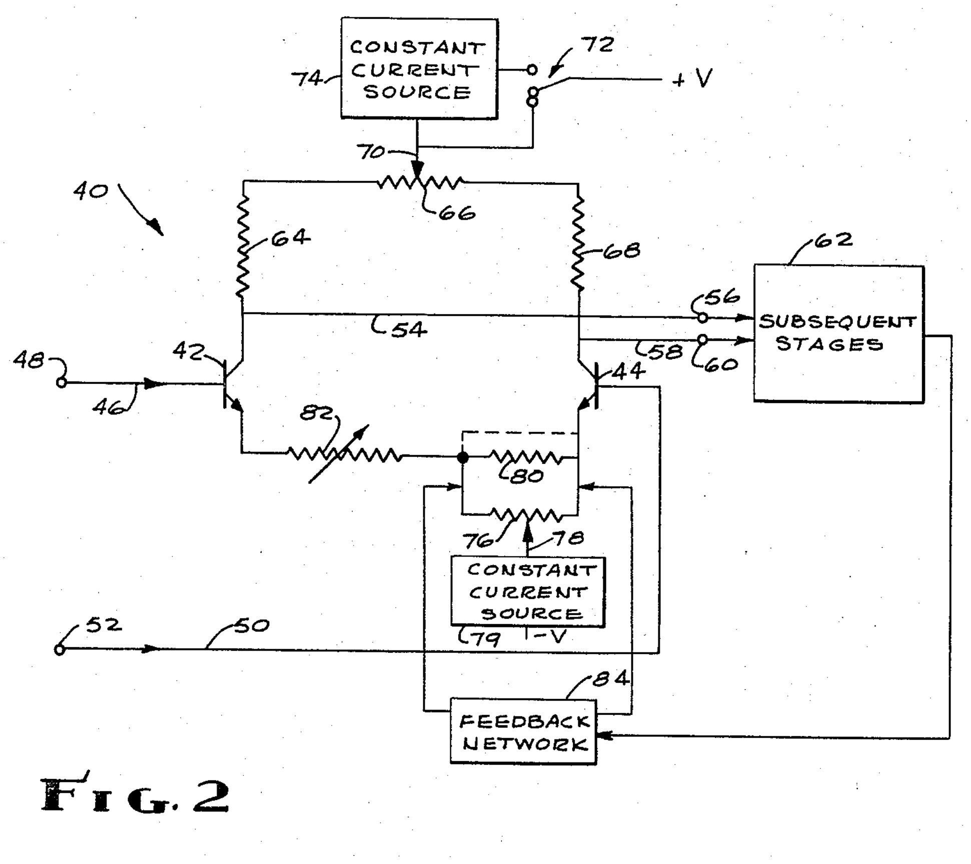

Further details of these and other novel features of the invention as well as additional objects and advantages thereof will become apparent and be best understood from a consideration of the following description taken in connection with the accompanying drawing which is presented by way of an illustrative example only, and in which:

FIG. 1 is a block diagram of a differential amplifier constructed in accordance with the principles of the present invention; and FIG. 2 is a schematic diagram of an example of a dual transistor amplifier stage constructed and adjusted according to the present invention.

Referring to the figures in more detail, it is stressed that the particulars shown are by way of example and illustrative discussion only and are presented in the cause of providing what is believed to be the most useful and readily understood description of principles and conceptual aspects of the invention. In particular, the detailed showing is not to be taken as a limitation upon the scope of the invention which is defined by the appended claims forming, along with the drawing, a part of this specification.

In FIG. 1 the block diagram of a dual input, differential amplifier is shown to include an input stage 10 having a pair of differential input terminals 12, 14. The stage 10 has, in this example, a double ended output as illustrated by the leads 16, 18 which serve also as the input terminals for one or more four-terminal subsequent stages 20. The double-ended output of the final subsequent stage 20 is coupled through leads 22, 24 to the dual input terminals of a single ending stage 26, the single output terminal 28 of which is coupled to the input terminal of an output stage 30. The output terminal 32 of the output stage 30 is coupled to the input terminal of a utilization device or load such as indicated in this example by an indicator 34. A lead 36 coupled from the output stage 30 back to the input stage 10 may be utilized as desired to complete a feedback loop. More than one lead may be used to complete this feedback loop if desireable.

In operation the input terminals 12, 14 of the input stage 10 may be coupled to the output terminals of a transducer device, not shown, such as a strain gauge or thermocouple. In instrumentation applications, where the present invention finds particularly useful application, such as transducer's output may be of a relatively very low voltage or current. Often the most important component in the input signal is a very low frequency or direct current component so that the input stage is desirably a direct coupled direct current amplifier stage. The input stage 10 is in this example a four-terminal network and its output signal is amplified by the subsequent stages 20 until the single ending of stage 26 converts the differential, two terminal signal into a single terminal signal, with respect to a common terminal, not indicated, which may then be amplified in the output stage 30 for further utilization or recording. As mentioned earlier, feedback may be provided through the lead 36 from the output stage 30 to the input stage 10. The feedback may be applied in a substantially conventional manner; and feedback loops other than the single one indicated may be utilized as desired, depending upon the desired optimum between system sensitivity and accuracy or stability.

In FIG. 2 an example of the input stage 10 is illustrated schematically. In a particular constructed example of the invention the network shown in FIG. 2 was utilized as the input stage 10 of FIG. 1. However, it can as well serve as one of the subsequent stages 20; or, indeed, a number of the stages substantially identical to that shown in FIG. 2 may be cascaded when desired for particular applications. In the figure, the network, indicated as 40, is shown in this example to include a pair of transistors 42, 44 which are preferably selected to have substantially similar electrical characteristics including the temperature coefficient defined above and which relates the change in base to emitter voltage with changes in the ambient absolute temperature of the physical transistor. The transistors are housed together in an environment such that whatever the ambient temperature is at any moment of time, it will be experienced in exactly the same manner by both of the transistors.

Each of the transistors 42, 44 has base, collector, and emitter electrodes as shown by the conventional symbols on the figure. The base electrode of the transistor 42 is coupled through a lead 46 to one of the dual input terminals 48 while the base electrode of the transistor 44 is coupled through a lead 50 to the other input terminal 52. Similarly, the collector electrode of the transistor 42 is coupled via a lead 54 to one of a pair of dual output terminals 56; and the collector electrode of the transistor 44 is coupled through a lead 58 to the other dual output terminal 60. These output terminals are in turn coupled to other portions of the amplifier system such as the subsequent stages 62 as indicated.

Interconnected, in this example, between the collector electrodes of the transistors 42, 44 is a resistive network including a collector load resistor 64, a three-terminal potentiometer 66, and a second collector load resistor 68, in a manner such that the electrical ends of the potentiometer 66 are connected to the ends of the collector load resistors 64, 68 at their ends opposite their associated collector electrodes. The movable potentiometer arm 70 of the potentiometer 66 is coupled alternatively, as indicated by the switch 72, either to a source of positive potential directly or through a constant current source 74.

Similarly to the resistive connection between the collector electrodes of the two transistors, a potentiometer 76 is coupled between the emitter electrodes of the transistors 42, 44; and the movable arm 78 of the potentiometer 76 is returned to a source of negative potential through a current generator 79 as shown. In this example, however, the potentiometer 76 may be shunted as shown by a resistor 80 and a variable resistor 82 is intercoupled between the potentiometer 76 and the emitter electrode of the transistor 42.

As desired, in appropriate applications, as indicated earlier in connection with the discussion of FIG. 1, a feedback network 84 may be coupled between the subsequent stages 62 and the emitters of 42 and 44.

In quiescent operation it may be seen that the network 40 provides a pair of parallel current paths between the source of positive potential and the source of negative potential. One path includes the movable arm 70 of the potentiometer 66, a portion of its resistance, the collector load resistor 64, the collector and emitter of the transistor 42, the variable resistor 82, and the movable arm 78 of the potentiometer 76. The other path includes the movable arm 70 and the other portion of the resistance of the potentiometer 66, the collector load resistor 68, the collector and emitter electrodes of the transistor 44, and the movable arm 78 of the potentiometer 76.

If the network 40 is balanced, as it may readily be for a particular ambient temperature, the magnitudes of current flowing through the two indicated paths are equal and there will be no voltage difference between the output terminals 56, 60. When, however, a differential signal is applied to the base electrodes of the transistors through the terminls 48, 52, the current through one of the transistors, and consequently through one of the current paths noted, will be different from that through the other transistor; and a voltage signal will appear between terminals 56, 60, which will be, in this example, an amplified representation of the low frequency or direct current differential signal applied between the input terminals 48, 52. However, the temperature characteristics of the two transistors 42, 44 will normally be at least somewhat different so that if the ambient temperature of the environment of the housing of the transistors is altered, one of the transistors will conduct differently from the other even though there is no input signal applied between the terminals 48, 52. The structure and the method of adjustment of the differential amplifier, in accordance with the principles of the present invention, substantially completely eliminate this cause of instability or unbalance, regardless of the operating temperature or change thereof of the transistors so long as they remain at the same temperature with respect to each other.

The method of adjustment of the network 40, according to the invention, includes first balancing the two current paths at a particular ambient temperature with zero differential signal input on the base electrodes of the transistors. This may be accomplished by shorting the terminals 48, 52 together. In addition it is generally preferable to short out the resistors 82, 80 so that the emitters of the transistors are shorted together and seek the same return path to the source of potential. Under these conditions the movable arm 70 of the potentiometer 66 is adjusted to equalize the current in the two paths so that a meter placed across the terminals 56, 60 reads zero volts. Next, the short across the resistor 80 is removed and the circuit is again balanced by adjusting the movable arm 78 of the potentiometer 76. Then with the value of the resistor 82 still zero and with the terminals 48, 52 still shorted together, a temperature coefficient plot is run across a range of temperature. The temperature coefficient of the network 40 may then be readily determined from the resulting graph and is generally substantially a straight line with a slope of a few microvolts per degree Kelvin.

The next step in the method of adjustment is to determine the absolute temperature of the environment of the transistors and multiply that temperature by the observed temperature coefficient to determine the number of volts to be deliberately caused to appear at the terminals 56, 60. The desired signal is caused to appear at the output of the network by removing the short from the potentiometer 82 and adjusting the differential current through the two transistors until he desired deliberate error signal is produced. The final step in the adjustment procedure is, with the input terminals 48, 52 still shorted, to readjust the potentiometers 66 and 76 as before for a zero signal output at the terminals 56, 60. It may be noted that, when desired or necessary, the variable potentiometer 82 may be placed on the opposite side of the resistor 80 in a manner to increase the emitter circuit resistance of the transistor 44 instead of that of the transistor 42 as shown.

Alternately a fixed resistor may be used on one side and a variable resistor on the other so that the variable resistor does not need to be changed from side to side.

When feedback is utilized in connection with the operation of the network 40, it may be coupled through leads as shown, and its unsymmetrical effect, if any, balanced out at the time that the potentiometer 76 is adjusted, as noted above.

As indicated earlier, in some applications of the invention the constant current source 74 may be utilized in lieu of or in connection with the source of positive potential for the network 40. One of the reasons for electing to include a constant current source in such an application is that its function of reducing or eliminating signals other than differential signals on the input terminals 48, 52, may be particularly useful and worthwhile.

It is also to be noted that in many examples of a differential direct current amplifier constructed in accordance with the principles of the present invention the resistive circuitry consisting of the resistor 80 and the potentiometer 76 in the emitter circuit of the network 40 may be deleted with the emitters returned identically to the current source but for the variable resistor 82 interposed in the emitter circuit of one of the transistors for the purposes set forth above. To this end, the resistor 80 may be removed or shorted by the dotted line shown.

In a numerical example of the operation of a differential amplifier as illustrated in FIG. 2, after the potentiometer 66 and the potentiometer 76 were adjusted to minimize the effective temperature coefficient, a small residual "error" resulted in a temperature coefficient of 1.5 microvolts per degree centigrade. In accordance with the method of the invention a differential in the base to emitter voltages of the two transistors was deliberately caused which precisely cancelled the residual temperature coefficient. In this example the absolute temperature of the environment was 300° K., so that the variable resistor 82 was adjusted to provide a differential signal at the output terminals 56, 60 equal to 450 microvolts. This deliberate error signal was then balanced out by readjusting the potentiometer 66 to reduce effectively the equivalent input voltage to zero. The net result of this procedure is to cause the difference in the base to emitter voltages of the two transistors to be approximately equal to 450 microvolts at the ambient temperature and to cause the net temperature coefficient to be substantially zero.

It may be noted that the readjustment of the potentiometer 66 changes the current through the potentiometer 82 and therefore the voltage across it to a slight extent. In the particular example discussed above, however, the change in this voltage is less than 2% and may for most utilizations be ignored; when desired, it may be effectively cancelled out by a further correction.

It has been found to be desirable in some utilizations of the invention to have a large zero control voltage on a differential amplifier to correct for zero on errors in transducers or other signal sources. An example is a thermocouple with which it is desired to look at a narrow range of temperature around some elevated temperature such as for example 250° C. This would typically provide a 10 millivolt differential input signal reference level. When it is desired to have the amplifier present a zero output when the temperature is 250° C., the potentiometer 82 may be set to zero and the potentiometer 66 adjusted to obtain approximately zero temperature coefficient. The potentiometer 82 is then set to any desired value to buck out effectively a part of the input voltage. In this example, since it is not desirable to modify the temperature coefficient of the amplifier, the potentiometer 66 is not readjusted after the potentiometer 82 is set to compensate for the input signal voltage reference level. A bucking voltage is therefore achieved without disturbing the temperature coefficient; and the same network can be used either to satisfy the offset zero of the amplifier without affecting the temperature coefficient, or, alternatively, it can be used to adjust the temperature coefficient, depending only on how the potentiometers 66, 76 are adjusted.

There have thus been disclosed a number of examples of a temperature independent amplifier and method which achieves the objects and exhibit the advantages set forth above.

What is claimed is:

1. The method of adjusting a direct-current transistor amplifier to have a substantially zero temperature drift co-efficient, said amplifier having at least one stage including first and second transistors each having an emitter, a collector and a base, said method comprising the steps of:

(1) Applying an input signal having a fixed predetermined value to said pair of transistors simultaneously;

(2) Setting the voltage drop across the base-emitter electrodes of said first transistor substantially equal to the voltage drop across the base-emitter electrodes of said second transistor;

(3) Adjusting a circuit element in said amplifier until the output voltage thereof is equaled to a predetermined value corresponding to the predetermined fixed input signal;

(4) Setting the base emitter voltage across said first transistor different from the base-emitter voltage across said second transistor by an amount equal to the temperature drift coefficient of said amplifier in microvolts per degree centigrade multiplied by the temperature of the environment of said amplifier in degrees Kelvin; and setting the output voltage of said amplifier to a value corresponding to said predetermined fixed input signal.

2. The method in accordance with claim 1 wherein the base emitter voltage of said first transistor is made different from the base emitter voltage of said second transistor by inserting a resistance element in series with the emitter of said first transistor.

3. The method as defined in claim 1 wherein the output voltage of said amplifier is adjusted by varying a resistive impedance element in the collector circuit of said first transistor.

References Cited

UNITED STATES PATENTS

| | | | |
|---|---|---|---|
| 2,949,546 | 8/1960 | McVey | 330—30 |
| 3,178,647 | 4/1965 | Harnett | 360—69 X |
| 3,182,269 | 5/1965 | Smith | 330—69 X |
| 3,194,985 | 7/1965 | Smith et al. | 330—30 |

FOREIGN PATENTS

| | | |
|---|---|---|
| 1,319,174 | 1/1963 | France. |

ROY LAKE, *Primary Examiner.*

NATHAN KAUFMAN, *Examiner.*